(12) United States Patent
Yano et al.

(10) Patent No.: US 7,068,353 B2
(45) Date of Patent: Jun. 27, 2006

(54) EXPOSURE APPARATUS AND METHOD

(75) Inventors: Koji Yano, Kanagawa (JP); Ryo Kuroda, Kanagawa (JP); Kohei Okamoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 430 days.

(21) Appl. No.: 10/011,974

(22) Filed: Dec. 11, 2001

(65) Prior Publication Data

US 2002/0071106 A1 Jun. 13, 2002

(30) Foreign Application Priority Data

Dec. 12, 2000 (JP) .............................. 2000-377176
Aug. 31, 2001 (JP) .............................. 2001-264132

(51) Int. Cl.
*G03B 27/54* (2006.01)
(52) U.S. Cl. ...................... 355/67; 355/53; 250/492.2; 430/5; 430/311
(58) Field of Classification Search ................ 430/311, 430/5; 250/492.2, 492.22, 492.23; 355/53
See application file for complete search history.

(56) References Cited

U.S. PATENT DOCUMENTS

| 5,637,424 A | * | 6/1997 | Haruki et al. .................. 430/5 |
| 6,171,730 B1 | | 1/2001 | Kuroda et al. ................. 430/5 |
| 6,187,482 B1 | | 2/2001 | Kuroda et al. ................. 430/5 |
| 6,559,926 B1 | * | 5/2003 | Yamaguchi et al. .......... 355/53 |
| 6,720,115 B1 | * | 4/2004 | Inao et al. ..................... 430/5 |
| 2002/0026260 A1 | * | 2/2002 | Hiroyuki .................... 700/121 |

FOREIGN PATENT DOCUMENTS

| JP | 2572023 | 10/1996 |
| JP | 11-145051 | 5/1999 |

* cited by examiner

*Primary Examiner*—John A. McPherson
*Assistant Examiner*—Daborah Chacko-Davis
(74) *Attorney, Agent, or Firm*—Fitzpatrick, Cella, Harper & Scinto

(57) ABSTRACT

An exposure apparatus includes a light-emitting portion arranged so as to be opposite to a photosensitive member at a position for exposure. A part of the light-emitting portion is smaller in width than a wavelength of light from the light-emitting portion.

8 Claims, 13 Drawing Sheets

FIG. 1A
FIG. 1B
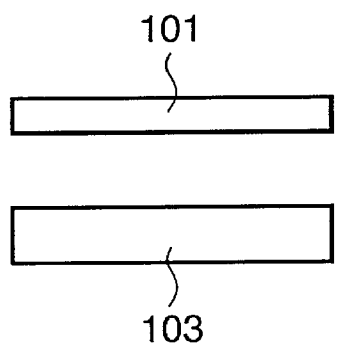
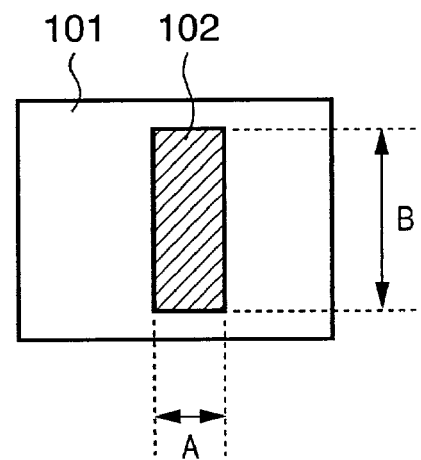

FIG. 10

| URL | http://www.maintain.co.jp/db/input.html |

TROUBLE DB INPUT WINDOW

OCCURRENCE DATE  [2000/3/15] ~1004
TYPE OF APPARATUS [**********] ~1001   1003
OBJECT  [OPERATION ERROR (START-UP ERROR)]
DEVICE S/N [465NS4580001] ~1002
DEGREE OF URGENCY [D] ~1005
SYMPTOM [LED KEEPS FLICKERING AFTER POWER-ON] ~1006

REMEDY [POWER ON AGAIN (PRESS RED BUTTON IN ACTIVATION)] ~1007

PROGRESS [INTERIM HAS BEEN DONE] ~1008

[SEND] [RESET]    1010              1011              1012
LINK TO RESULT LIST DATABASE   SOFTWARE LIBRARY   OPERATING GUIDE

SEMICONDUCTOR DEVICE MANUFACTURING FLOW

EXPOSURE APPARATUS AND METHOD

FIELD OF THE INVENTION

The present invention relates to nm-order micropatterning for semiconductors and the like.

BACKGROUND OF THE INVENTION

Recent advances of semiconductor micropatterning techniques enable processing at the 100 [nm] level. Along with this, the integration degree is increasing, and new devices using the quantum effect, or the like, are being manufactured. For example, Japanese Patent Laid-Open No. 11-145051 discloses an exposure method using near-field light. In general, a conventional projection exposure apparatus is limited in micropatterning by the wavelength of a light source. However, an exposure apparatus using near-field light realizes processing of a light wavelength or less.

A conventionally-disclosed micropatterning apparatus using near-field light adopts an opening smaller than the wavelength of a light source, and utilizes a near-field formed by the opening. Thus, the apparatus is limited in light quantity to be obtained and in shortening the exposure time.

An exposure apparatus and a method using a near-field formed by such a small opening are difficult to bring a plurality of openings close to each other and perform exposure independently through these openings.

SUMMARY OF THE INVENTION

The present invention has been made to overcome the conventional drawbacks, and has as its first object to provide an exposure apparatus and a method capable of realizing processing at a resolving power corresponding to a wavelength shorter than the wavelength of a light source, and shortening the exposure time.

It is the second object of the present invention to provide an exposure apparatus and a method for independently exposing close patterns.

The present inventors have made extensive studies by trial and error in order to achieve the first and second objects, and have found that the objects could be achieved by the following means, completing the present invention.

To achieve the above objects, according to the present invention, there is provided an exposure apparatus comprising a light-emitting portion arranged so as to be opposite to a photosensitive member at a position for exposure, the light-emitting portion having at least part of a width smaller than a wavelength of light from the light-emitting portion.

In the present invention, the exposure apparatus can further comprise a plurality of light-emitting portions, and an emission control device causing the plurality of light-emitting portions to selectively emit light. The light-emitting portion preferably emits light by voltage application. Also, preferably, the light-emitting portion is formed from a semiconductor ultra-fine particle. Furthermore, the light-emitting portion can take an arbitrary shape.

Preferably, the exposure apparatus further comprises a positioning mechanism for arranging the light-emitting portion and the photosensitive member so as to adjust a distance between the light-emitting portion and the photosensitive member to be shorter than the emission wavelength of the light-emitting portion, and performing exposure. Preferably, the positioning mechanism detects a distance by using an electrostatic capacitance sensor, and controls the distance by using a piezoelectric element.

Preferably, the exposure apparatus further comprises a display, a network interface, and a computer for executing network software, and the display, the network interface, and the computer enable data communication of maintenance information for the exposure apparatus via a computer network. Preferably, the network software provides on the display the user interface for accessing a maintenance database provided by a vendor or user of the exposure apparatus and is connected to the external network outside a factory in which the exposure apparatus is installed, and enables obtaining information from the database via the external network.

To achieve the above objects, according to the present invention, there is provided an exposure method using a light-emitting portion including a portion whose width is smaller than an emission wavelength of the light-emitting portion, wherein the light-emitting portion and a photosensitive member are so arranged as to adjust a distance between the light-emitting portion and the photosensitive member to be shorter than the emission wavelength of the light emitting portion, and the photosensitive member is exposed by causing the light-emitting portion to emit light.

In the above method, preferably, exposure is performed by causing a plurality of light-emitting portions to selectively emit light. Also, preferably the light-emitting portion includes a member for emitting light by voltage application.

According to another aspect of the invention, there is provided a semiconductor device manufacturing method comprising the steps of installing, in a semiconductor manufacturing factory, manufacturing apparatuses for performing various processes, including the exposure apparatus according to the present invention, and manufacturing a semiconductor device by a plurality of processes using the manufacturing apparatuses.

Preferably, the semiconductor device manufacturing method further comprises the steps of connecting the manufacturing apparatuses via a local area network, and communicating information about at least one of the manufacturing apparatuses between the local area network and an external network outside the semiconductor manufacturing factory. In the semiconductor device manufacturing method, it is preferably that a database provided by a vendor or use of the exposure apparatus be accessed via the external network, thereby obtaining maintenance information of the manufacturing apparatuses by data communication, or data communication be performed between the semiconductor manufacturing factory and another semiconductor manufacturing factory via the external network, thereby performing production management.

According to another aspect of the invention, there is provided a semiconductor manufacturing factory comprising manufacturing apparatuses for performing various processes, including the exposure apparatus according to the present invention, a local area network for connecting the manufacturing apparatuses, and a gateway for allowing access to an external network outside the factory from the local area network, wherein data communication of information about at least one of the manufacturing apparatuses is enabled.

According to another aspect of the present invention, there is provided a maintenance method for the exposure apparatus according to the present invention, that is installed in a semiconductor manufacturing factory, the method comprising the steps of making a vendor or user of the exposure apparatus provide a maintenance database connected to an external network outside the semiconductor manufacturing factory, allowing access to the maintenance database from the semiconductor manufacturing factory via the external network, and transmitting maintenance information accumulated in the maintenance database to the semiconductor manufacturing factory via the external network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1A is a sectional view for explaining a light-emitting portion according to an embodiment of the present invention when a plate-like member having the light-emitting portion is close to an object to be exposed that has a photosensitive portion;

FIG. 1B is a plan view of the plate-like member in FIG. 1A when viewed from below the plate-like member, i.e., from a side close to the object to be exposed;

FIG. 10 is a view showing an example of a user interface in the semiconductor device production system including the exposure apparatus according to the embodiment of the present invention;

DETAILED DESCRIPTION OF THE PREFERRED EMBODIMENTS

Preferred embodiments of the present invention will now be described in detail in accordance with the accompanying drawings.

An exposure apparatus according to a preferred embodiment of the present invention is used to process a small region by irradiating a photosensitive material in the small region with light. That is, a pattern is formed by irradiating with light a photosensitive material which chemically, physically changes by irradiation of light. For example, this exposure apparatus is employed when a resist applied to a semiconductor surface is irradiated to form a pattern.

At least part of a light-emitting portion in this embodiment is smaller in width than the wavelength. The width of the light-emitting portion means one when viewed from a plane facing a photosensitive member to be exposed.

FIGS. 1A and 1B are views for explaining a light-emitting portion according to the embodiment of the present invention. FIG. 1A is a sectional view when a plate-like member having the light-emitting portion is close to an object to be exposed that has a photosensitive portion. FIG. 1B is a plan view of the plate-like member in FIG. 1A when viewed from below the plate-like member, i.e., from a side close to the object to be exposed. A light-emitting portion 102 is buried in a plate-like member 101. In FIG. 1B, the light-emitting portion 102 is hatched. The exposure apparatus according to the embodiment has the light-emitting portion 102. In the light-emitting portion 102 shown in FIG. 1B, lengths A and B in FIG. 1B correspond to the width of the light-emitting portion 102. In this case, at least either A or B is shorter than an emission wavelength (at least part of the light-emitting portion 102 is smaller in width than the emission wavelength of the light-emitting portion 102). Note that the light-emitting portion 102 is not limited to a rectangle, and may take any shape such as a circle or polygon.

Figure 2A:
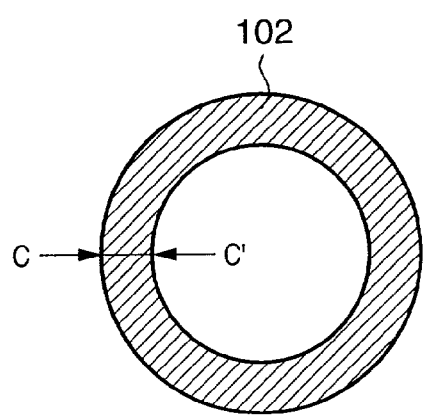
FIGS. 2A and 2B are views showing other examples of the light-emitting portion in FIGS. 1A and 1B.
Figure 2B:
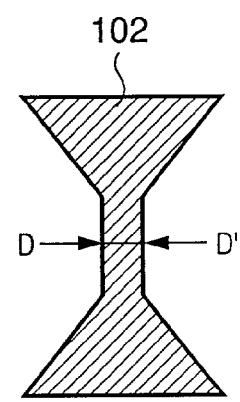

FIGS. 2A and 2B are views showing another example of the light-emitting portion 102 in FIG. 1B. In FIGS. 2A and 2B, the light-emitting portion 102 is hatched. FIG. 2A shows an example of a ring-like light-emitting portion 102. In this case, a width C-C' as the width of the light-emitting portion 102 is smaller than the emission wavelength. FIG. 2B shows a light-emitting portion 102 with an arbitrary shape. A portion D-D' in FIG. 2B is smaller than the emission wavelength.

These light-emitting portions 102 require a small light-emitting member. An example of the light-emitting member is an EL element obtained by sandwiching semiconductor ultra-fine particles with a diameter of several [nm] between electrodes. In this embodiment, light emitted by the light-emitting portion 102 directly irradiates an object to be exposed without passing through a small opening with a diameter smaller than the wavelength. The object can be irradiated with stronger light, shortening the exposure time.

This embodiment adopts an alignment mechanism for arranging the light-emitting member close to an object to be exposed. The alignment mechanism controls the distance between the light-emitting member and an object to be exposed so as to be shorter than the emission wavelength of the light-emitting portion. As an example of the alignment mechanism, the distance is detected by an electrostatic capacitance sensor, and controlled by a piezoelectric element. More simply, a very small projection may be used as a stopper to control the distance.

In the examples shown in FIGS. 1A and 1B, the member 101 having the light-emitting portion 102 is moved close to an object 103 to be exposed. In this embodiment, the distance between the light-emitting portion 102 and the object 103 is adjusted by the alignment mechanism so as to be shorter than the emission wavelength of the light-emitting portion 102. If the light-emitting portion 102 emits light in this state, the object 103 is irradiated with light in a pattern corresponding to the emission pattern of the light-emitting portion 102. The pattern corresponding to the emission pattern of the light-emitting portion 102 is formed on the object 103.

The exposure apparatus according to the embodiment can attain a resolving power higher than that corresponding to the emission wavelength because the distance between the light-emitting portion and the object to be exposed is shorter than the emission wavelength. In the embodiment, the width of at least part of the emission pattern of the light-emitting portion is smaller than the wavelength. A location of the object that corresponds to the small-width portion undergoes exposure with a width smaller than the emission wavelength. As a result, a pattern shorter than the emission wavelength is transferred. Compared to a case wherein light is incident through an opening, the light quantity can be increased, and the exposure time can be shortened.

It is preferable for the exposure apparatus according to the embodiment to arrange a plurality of light-emitting portions and to cause them to selectively emit light. This arrangement can solve a shortage of the light quantity, and can also solve the problem of a conventional exposure apparatus that a mask must be exchanged in exposing different patterns (close patterns can be independently exposed).

In this embodiment, therefore, at least two light-emitting portion as described above are so arranged as to selectively emit light. If a given light-emitting portion out of the plurality of light-emitting portions changes, its emission pattern changes, changing a pattern to be exposed. Since a pattern to be exposed can be changed by changing the emission pattern, the embodiment can eliminate exchange of masks even in exposure with different exposure patterns, unlike the conventional exposure apparatus.

The emission pattern of light is not narrowed by a small opening. Thus, the embodiment enables a structure in which the light-emitting portions are arranged adjacent to each other at an interval smaller than their wavelength and caused to selectively emit light (emission control device for causing the light-emitting portions to selectively emit light).

By giving the light-emitting portion a feature which allows this portion to emit light by voltage application, the embodiment can control emission by the voltage, simplifying the control. Examples of this structure are an EL element in which Si ultra-fine particles several [nm] in diameter are arranged between electrodes and a voltage is applied between the electrodes to emit light, and tunnel emission of arranging a tunnel barrier between electrodes and applying a voltage between the electrodes to emit light.

Preferred embodiments of an exposure apparatus, an exposure method, and a semiconductor production system according to the present invention will be described in detail with reference to the accompanying drawings.

[Embodiment of Exposure Apparatus and Method]

Figure 3A:
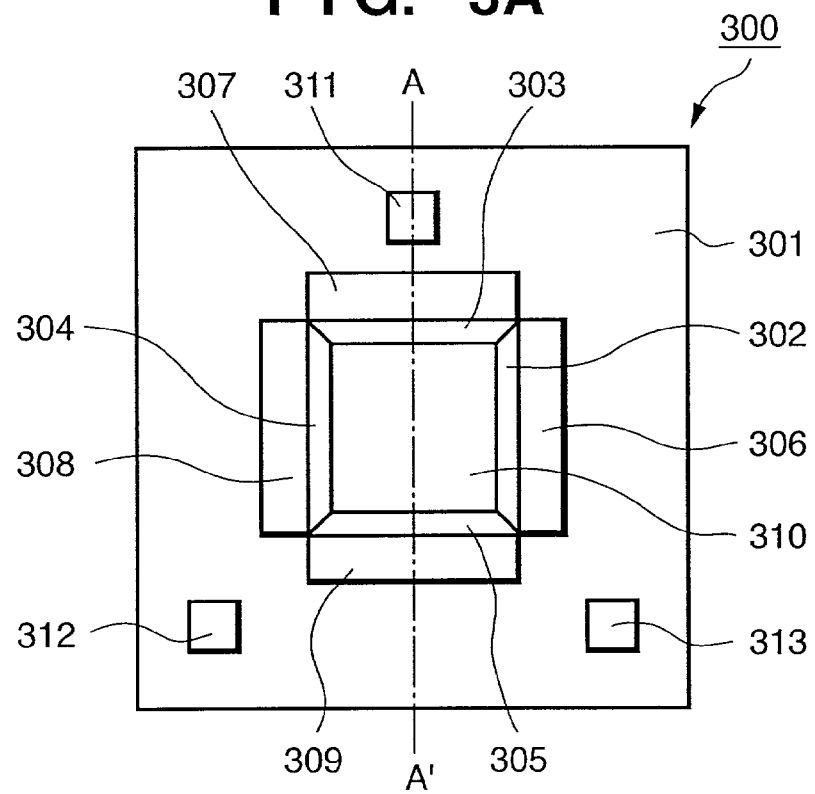
FIG. 3A is a schematic plan view showing an exposure-side member in the exposure apparatus according to the embodiment of the present invention.
Figure 3B:
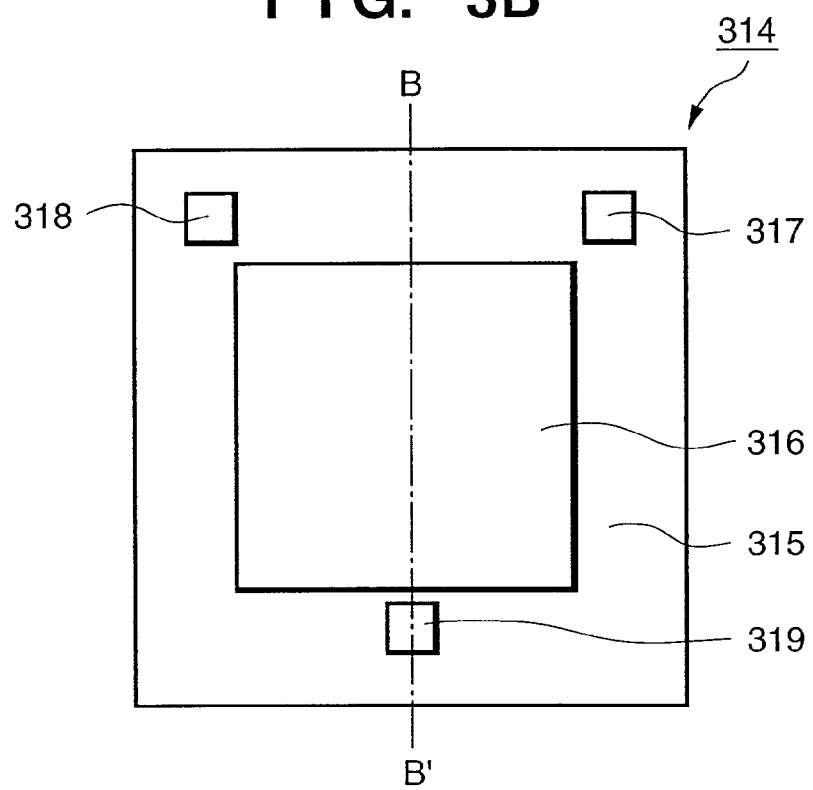
FIG. 3B is a schematic plan view showing a substrate-support-side member in the exposure apparatus according to the embodiment of the present invention.

FIGS. 3A and 3B are schematic views showing the main part of an exposure apparatus according to a preferred embodiment of the present invention. FIG. 3A is a plan view showing an exposure-side member, and FIG. 3B is a plan view showing a substrate-support-side member. In this embodiment, the exposure apparatus uses an Si ultra-fine particle as a light-emitting member, and an electrostatic capacitance sensor and piezoelectric element as an alignment mechanism. FIG. 4 is a sectional view taken along the line A-A' in FIG. 3A, and FIG. 4B is a sectional view taken along the line B-B' in FIG. 3B.

The exposure apparatus of the embodiments is constituted by an exposure-side member 300 and a substrate-support-side member 314. The exposure-side member 300 comprises a light source, an electrode, and an electrostatic capacitance sensor on a support substrate 301. This embodiment adopts a silicon substrate as the support substrate 301. First, second, third, and fourth light-emitting portions 302, 303, 304, and 305 are formed on the support substrate 301. These light-emitting portions 302 to 305 are formed from Si ultra-fine particles 3 [nm] in diameter. Each of the ultra-fine particles is surrounded by $SiO_2$. A common electrode 310 is formed at the center between the first to fourth light-emitting portion 302 to 305. First to fourth electrodes 306 to 309 are disposed at positions with respect to first to fourth light-emitting portions 302 to 305. For example, a voltage is applied to the first light-emitting portion 302 from the common electrode 310 and first electrode 306. The voltage application causes the Si ultra-fine particles of the first light-emitting portion to emit light. The emission wavelength of the Si ultra-fine particle serving as each light-emitting portion in the embodiment changes depending on the diameter, and is about 780 [nm] for a diameter of 3 [nm].

Although the embodiment uses a 3 [nm]-diameter Si ultra-fine particle, the emission wavelength can be changed by changing the diameter. For a smaller diameter, the emission wavelength can be shortened. The interval between the first electrode 306 and the common electrode 310, i.e., the width of the first light-emitting portion 302 is 20 [nm]. The length of the first electrode 306 (in a direction perpendicular to the direction of width and in a direction parallel to the sheet surfaces of FIGS. 3A and 3B) is 100 [nm]. The second to fourth light-emitting portions 303 to 305 also have the same structure.

First, second, and third electrostatic capacitance sensor pads 311, 312, and 313 are formed on the support substrate 301. The first electrostatic capacitance sensor pad 311 is set at a position corresponding to another first electrostatic capacitance sensor pad 319 formed on the substrate-support-side member 314. The distance between the pads 311 and 319 can be detected from their electrostatic capacitances. Similarly, the second electrostatic capacitance sensor pad 312 is set at a position corresponding to another second electrostatic capacitance sensor pad 318, and the third electrostatic capacitance sensor pad 313 is set at a position corresponding to another third electrostatic capacitance sensor pad 317. Their distances are detected.

Figure 4A:
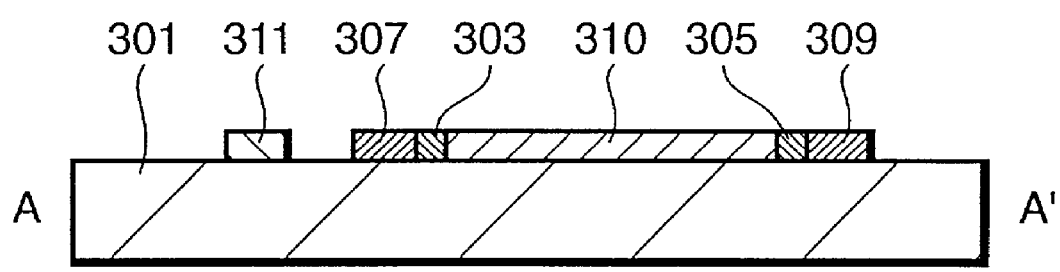
FIG. 4A is a sectional view taken along the line A-A' in FIG. 3A.
Figure 4B:
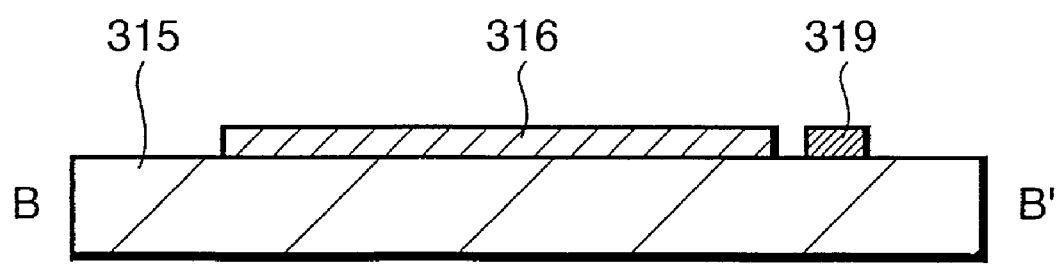
FIG. 4B is a sectional view taken along the line B-B' in FIG. 3B.

As shown in FIG. 4A, the surface of the common electrode 310, those of the first to fourth light-emitting portions 302 to 305, those of the first to fourth electrodes 306 to 309, and those of the electrostatic capacitance sensor pads 311, 312, and 313 are almost flush with each other. The surfaces of the first electrode 306, common electrode 310, and first light-emitting portion 302 are preferably flush with each other as much as possible. If, for example, the surface of the first light-emitting portion 302 projects from those of the common electrode 310 and first electrode 306, and electric field near the surface of the first light-emitting portion 302 becomes weak, and the first light emitting portion 302 may fail to emit light. If the surface of the first light-emitting portion 302 is recessed from those of the common electrode 310 and first electrode 306, the first light-emitting portion 302 is difficult to be moved close to a facing substrate to be exposed. Similarly, the surface of a substrate 316 to be exposed, and those of the electrostatic capacitance sensor pads 317 to 319 are desirably almost flush with each other.

FIGS. 5A to 5C, 6A, and 6B are views showing an example of a method of manufacturing the exposure-side member 300 in FIG. 3A. This example will be described with reference to FIGS. 5A to 5C, 6A, and 6B. In FIGS. 5A to 5C, 6A, and 6B, the left side is a sectional view, and the right side is a plan view when viewed from the top.

Reference numeral 501 denotes an Si substrate having a thermal oxide film on its surface. Underlying interconnections 502 to 509 are formed on the Si substrate 501 by lithography. The interconnection material is Al, W, Ti, or the like. An $SiO_2$ film 510 is sputtered. Contact holes 511 to 518 are formed in the $SiO_2$ film 510 (FIG. 5A).

Figure 5A:
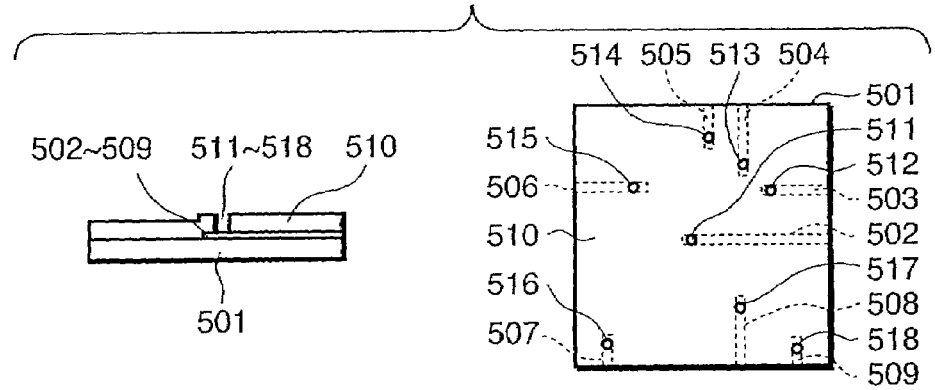
FIG. 5A is a view showing a state wherein a contact hole is formed in an $SiO_2$ film by a method of manufacturing an exposure-side member 300 in FIG. 3A.

At this time, as shown on the left side of FIG. 5A, portions having the underlying interconnections 502 to 509 slightly swell. The contact hole 511 is for electrically connecting a common electrode 541 (to be described later) and the underlying interconnection 502. The contact holes 512, 513, 515, and 517 are for connecting first, second, third, and fourth electrodes 537, 538, 539, and 540 (to be described later) and the underlying interconnections 503, 504, 506, and 508. The contact holes 514, 516, and 518 are for connecting first, second, and third electrostatic capacitance sensor pads 542, 543, and 544 and the underlying interconnections 505, 507, and 509.

Figure 5B:
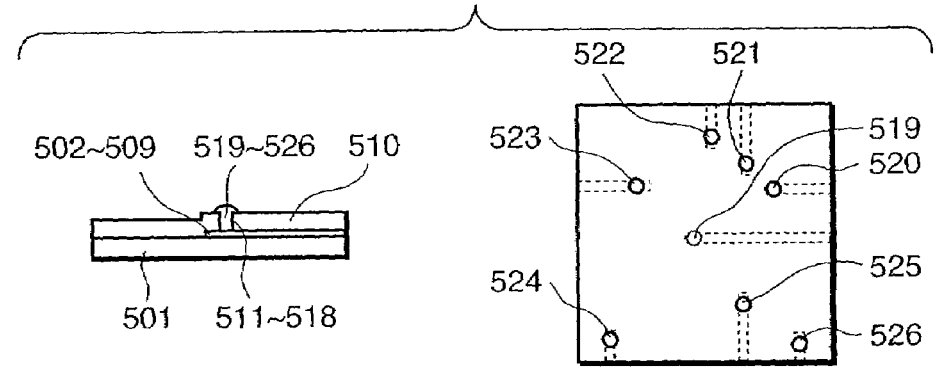
FIG. 5B is a view showing a state wherein a metal is buried in the contact hole by planting by the method of manufacturing the exposure-side member 300 in FIG. 3A.

The contact holes 511 to 518 are filled with a metal by plating. This state is shown in FIG. 5B. In FIG. 5B, reference numerals 519 to 526 denote metal portions buried in the contact holes 511 to 518.

Figure 5C:
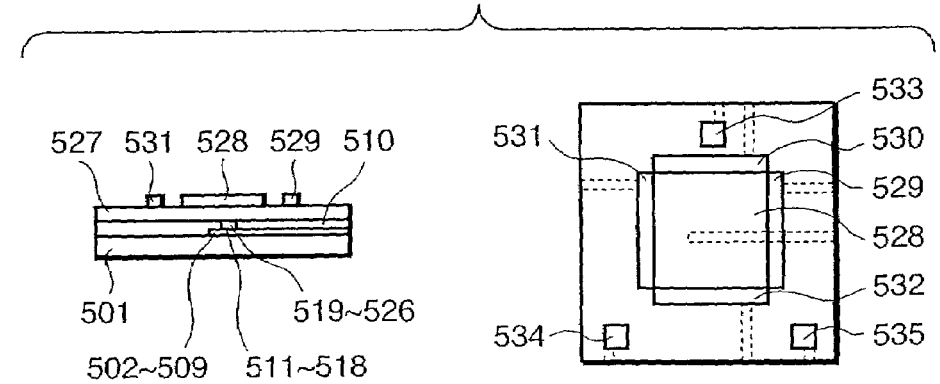
FIG. 5C is a view showing a state wherein a resist pattern is formed by the method of manufacturing the exposure-side member 300 in FIG. 3A.

Surface polishing is done to planarize the surface of the $SiO_2$ film 510. A metal thin film 527 serving as the common electrode 541, first to fourth electrodes 537 to 540, and first to third electrostatic capacitance sensor pads 542 to 544 is formed on the planarized $SiO_2$ film 510 (FIG. 5C).

A resist is coated, exposed by EB exposure, or the like, and developed to form resist patterns 528 to 535. The resist pattern 528 is for forming the common electrode 541 shown in FIG. 6B. The resist patterns 529 to 532 are for forming the first to fourth electrodes 537 to 540. The resist patterns 533 to 535 are for forming the first to third electrostatic capacitance sensor pads 542 to 544. A state after these resist patterns are formed is shown in FIG. 5C. The first to fourth electrodes 537 to 540 are identical to the first to fourth electrodes 306 to 309 in FIG. 3A; the common electrode 541, to the common electrode 310; and the first to third electrostatic capacitance sensor pads 542 to 544, the first to third electrostatic capacitance sensor pads 311 to 313.

Then, an Si ultra-fine particle film 536 is formed. As the film formation method, a method disclosed in Japanese Patent Registration No. 02572023 can be applied. According to this method, a plasma is generated by microwaves within a cavity resonator by using $SiH_4$ gas and, if necessary, $H_2$ gas. The gas is decomposed and reacted to form fine particles. These fine particle are sprayed as a beam from a nozzle together with an unreacted gaseous active species. A state after the Si ultra-fine particle film is formed is shown i FIG. 6A. Note that the ultra-fine particle film 536 is not illustrated in the right side view, i.e., plan view of FIG. 6A.

Figure 6A:
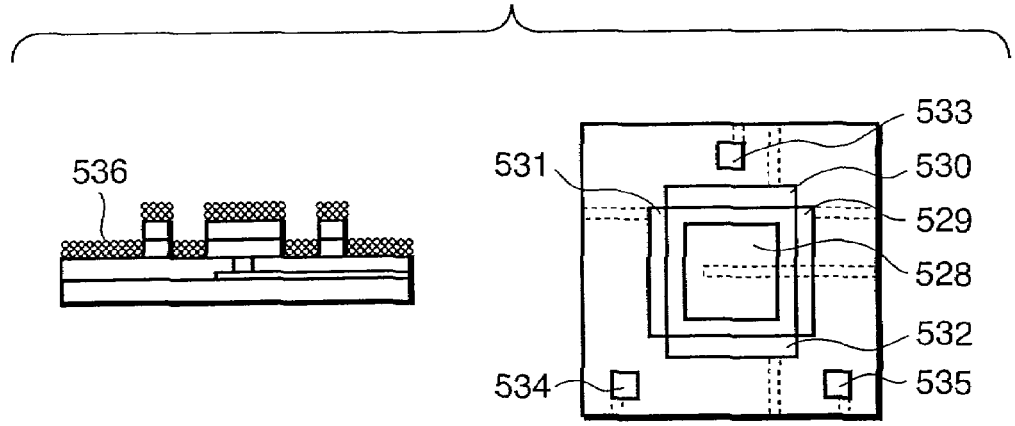
FIG. 6A is a view showing a state wherein an Si ultra-fine particle film is formed by the method of manufacturing the exposure-side member 300 in FIG. 3A.
Figure 6B:
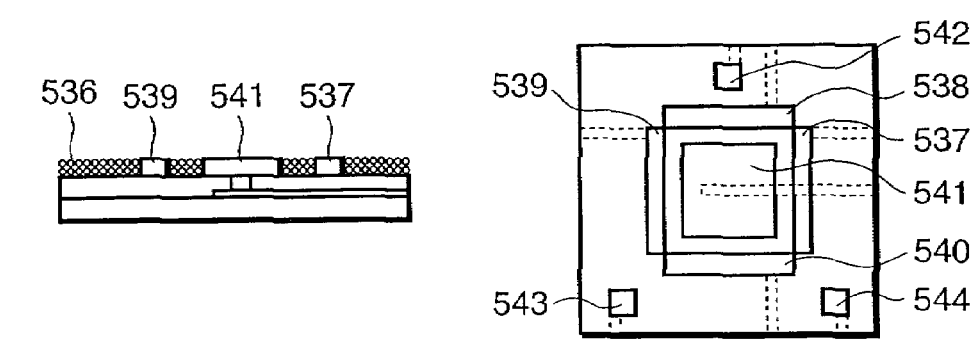
FIG. 6B is a view showing a state wherein the resist pattern is removed by the method of manufacturing the exposure-side member 300 in FIG. 3A.

As shown in FIG. 6B, the resist patterns 528 to 535 are removed. At this time, the Si ultra-fine particles on the resist patterns are removed together with the resist. Si ultra-fine particles are left between the common electrode 541 and the first to fourth electrodes 537 to 540. In the exposure-side member 300 manufactured by this method, Si ultra-fine particles also exist outside the first to fourth electrodes 537 to 540, but do not influence exposure because no voltage is applied to the outside.

The substrate-support-side member 314 does not require any light-emitting portion. The remaining structure of the substrate-support-side member 314 can be manufactured by the same method as that for the exposure-side member.

The substrate-support-side member 314 supports the substrate 316 to be exposed on a support substrate (support member) 315. The substrate-support-side member 314 also comprises the electrostatic capacitance sensor pads 317 to 319 for measuring the distance between the substrate-support-side member 314 and the exposure-side member 300. This embodiment uses a resist-coated Si substrate as the substrate 316.

Figure 7:
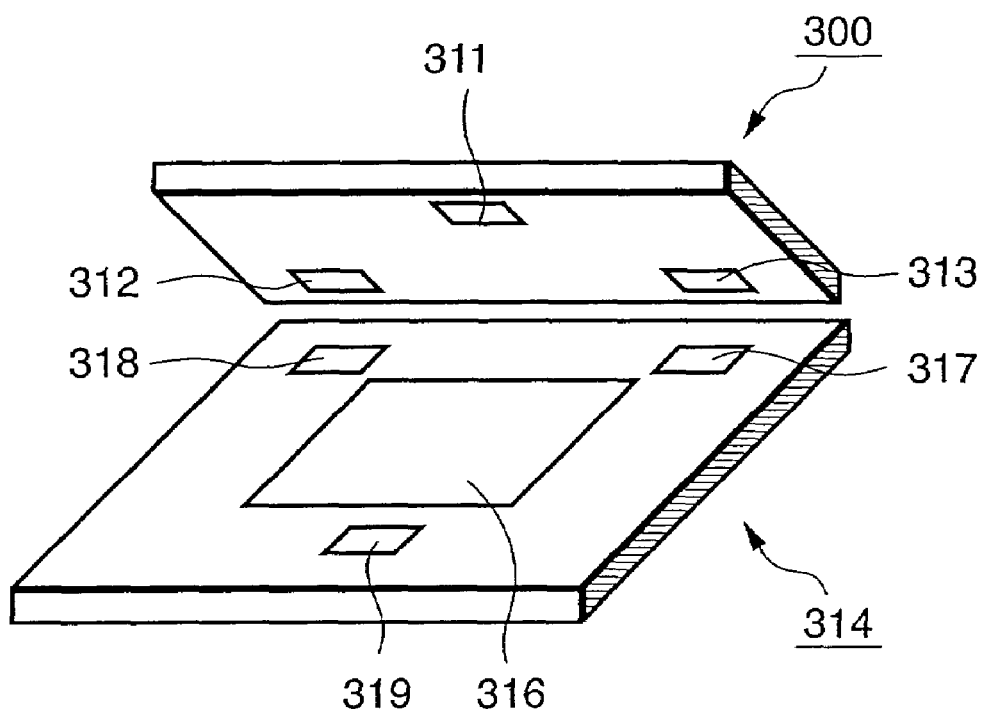
FIG. 7 is a view showing a method of bringing the exposure-side member 300 and a substrate-support-side member 314 in FIGS. 3A and 3B close to each other.

Exposure is performed as follows. FIG. 7 is a view showing a method of bringing the exposure-side member 300 and substrate-support-side member 314 in FIGS. 3A and 3B close to each other. This method will be described with reference to FIGS. 3A, 3B, 4A, 4B, and 7. The exposure-side member 300 and substrate-support-side member 314 are brought close to each other such that the first to fourth light-emitting portions 302 to 305 come close to the substrate 316, as shown in FIG. 7. Examples of a mechanism for bringing the members 300 and 314 close to each other are a mechanism for arranging the mask and wafer of a conventional proximity exposure apparatus close to each other, and a proximity mechanism for a mask and a wafer as disclosed in Japanese Patent Laid-Open No. 11-145051. This mechanism is not illustrated, and a detailed description thereof will be omitted.

The first electrostatic capacitance sensor pads 311 and 319, second electrostatic capacitance sensor pads 312 and 318, and third electrostatic capacitance sensor pads 313 and 317 come close to each other, and the intervals between these sensors are measured. This measurement is done by analyzing outputs from the respective sensors by a signal processing unit (not shown). At this time, the distance between the light-emitting portions 302 to 305 and the substrate 316 can be calculated in consideration of a level difference when the level difference exists between the surfaces of the first to third electrostatic capacitance sensor pads 311 to 313 and those of the first to fourth light-emitting portions 302 to 305 on the exposure-side member 300, or when the level difference exists between the surfaces of the electrostatic capacitance sensor pads 317 to 319 and that of the substrate 316. The exposure-side member 300 and substrate-support-side member 314 are brought close so as to be parallel to each other. The first to fourth light-emitting portions 302 to 305 come close to the surface of the substrate 316. In this embodiment, the first to fourth light-emitting portions 302 to 305 are set such that the distance to the surface of the substrate 316 becomes shorter than 780 [nm], which is the emission wavelength of each light emitting portion.

In this state, the common electrode 310 is set to 0 [V], a voltage is applied to the first electrode 306, and then the first light-emitting portion 302 emits light. By this emission, the substrate 316 is irradiated with light to expose the resist on the substrate 316. A pattern to be exposed is the same as the pattern of the first light-emitting portion 302. The first light-emitting portion 302 is 20 [nm] in width and 100 [nm] in length. The pattern to be exposed is much smaller in width and length than 780 [nm], which is the emission wavelength of the first light-emitting portion 302.

If the first light-emitting portion 302 and substrate 316 are spaced apart from each other, the surroundings of the pattern to be exposed become out of focus. Thus, the first light-emitting portion 302 and substrate 316 are preferably as close as possible. At this time, the second to fourth light-emitting portions 303 to 305 may also emit light. A pattern to be exposed depends on a light-emitting portion which has emitted light. It is also possible to exchange the substrate 316 with another one and similarly expose the exchanged substrate. In this case, if a light-emitting portion is changed, another pattern can be exposed.

Figure 13:
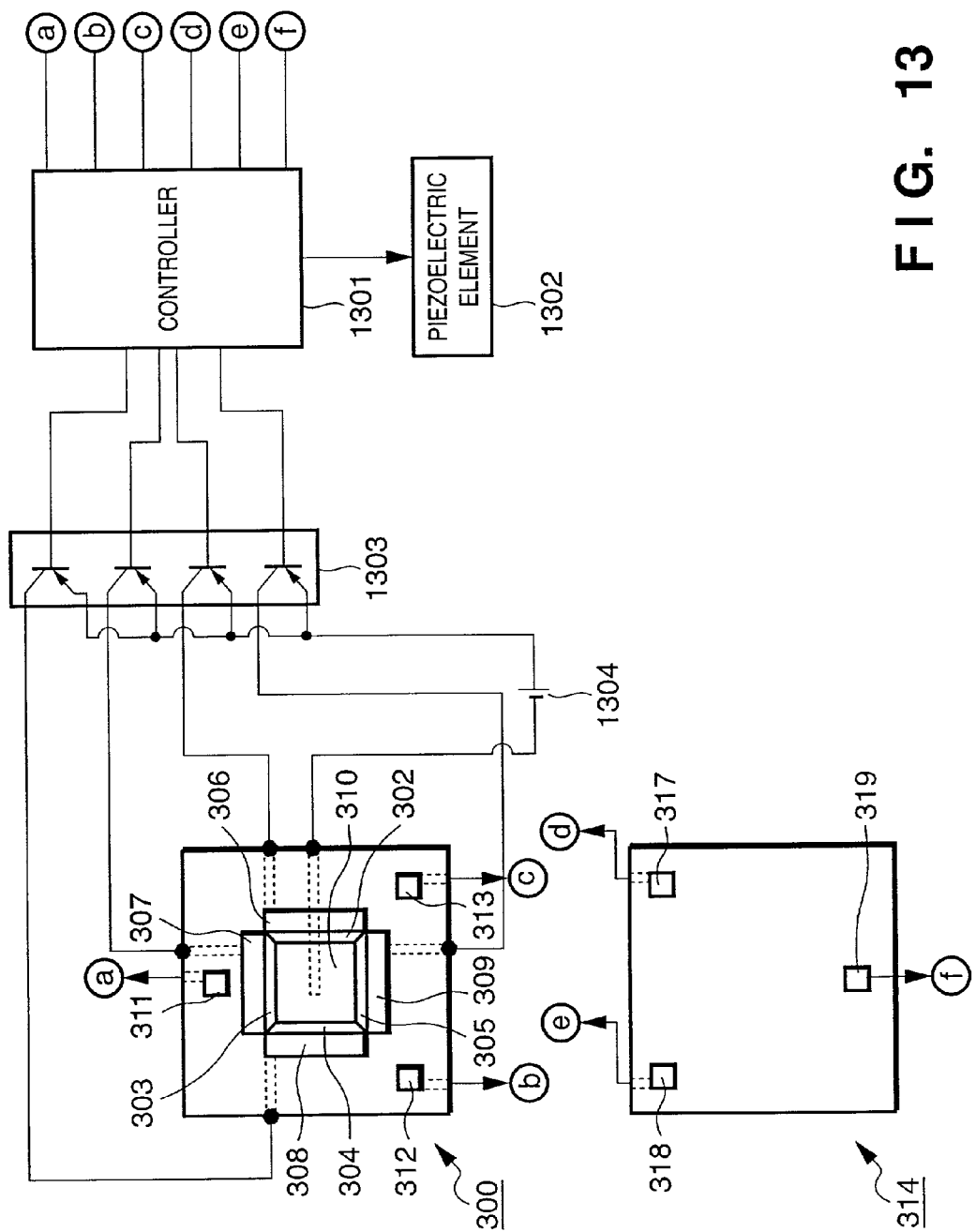
FIG. 13 is a diagram for explaining the driving arrangement of the light-emitting portion according to the embodiment.

FIG. 13 is a diagram showing a hardware arrangement for the above-described exposure control. In FIG. 13, a controller 1301 performs various control operations for the exposure apparatus, and comprises a CPU and a memory (neither is shown). The controller 1301 executes positional control of the exposure-side member 300 and substrate-support-side member 314, and emission control of the first to fourth light-emitting portions 302 to 305.

More specifically, the controller 1301 receives detection signals from the first to third electrostatic capacitance sensors 311 to 313 on the exposure-side member 300 and the electrostatic capacitance sensors 317 to 319 on the substrate-support-side member 314. The controller 1301 drives and controls a piezoelectric element 1302, thereby controlling the distance between the exposure-side member 300 and the substrate-support-side member 314. After positioning the members 300 and 314, the controller 1301 drives the first to fourth light-emitting portions 302 to 305 in a pre-programmed order. As an example of a driving mechanism for the light-emitting portions, the electrodes 306 to 309 are connected to the switching elements of a switching circuit 1303. In this case, the voltage of a power supply 1304 is applied to an electrode connected to a switching element driven by a signal from the controller 1301, and a light-emitting portion adjacent to the electrode emits light.

In this manner, according to the embodiment, a pattern to be exposed/formed on a resist on the substrate 316 can be changed by changing the emission pattern of a light-emitting portion. If the exposure-side member 300 is made exchangeable, like a conventional mask or reticle, this facilitates maintenance and allows exchanging the exposure-side member with one having another layout of light-emitting portions. In this case, the degree of freedom is attained for a pattern to be exposed.

The above example has assumed exposed/formation of a pattern on a resist without any existing pattern on a substrate to be exposed. The present invention can also be applied to a state wherein a (circuit) pattern has already been formed on a substrate to be exposed. In this case, an existing pattern and an emission pattern must be positioned (aligned) within a plane. For example, a so-called alignment mechanism for aligning a conventional mask (reticle) and wafer is employed as a mechanism for positioning the exposure-side member of the above-described apparatus and a substrate to be exposed.

[Embodiment of A Semiconductor Production System]

A production system for a semiconductor device (e.g., a semiconductor chip, such as an IC or LSI, a liquid crystal plane, a CCD, a thin-film magnetic head, a micromachine, or the like) using the above-described exposure apparatus will be exemplified. A trouble remedy or periodic maintenance of a manufacturing apparatus installed in a semiconductor manufacturing factory, or maintenance service, such as software distribution is performed by using, e.g., a computer network outside the manufacturing factory.

Figure 8:
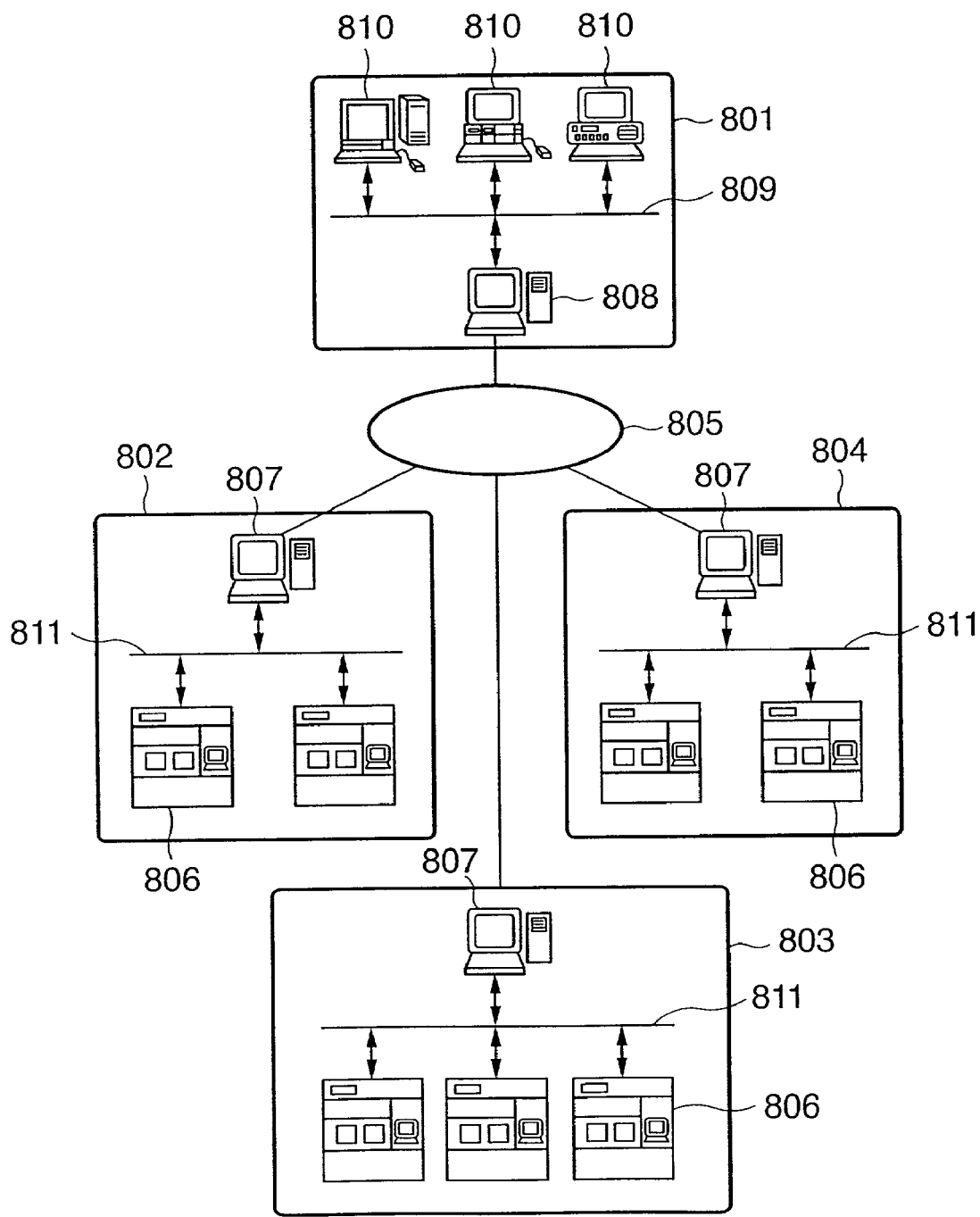
FIG. 8 is a view showing the concept of a semiconductor device production system, including the exposure apparatus according to the embodiment of the present invention, when viewed from a given angle.

FIG. 8 shows the overall system cut out at a given angle. In FIG. 8, reference numeral 801 denotes a business office of a vendor (e.g., an apparatus supply manufacturer), which provides a semiconductor device manufacturing apparatus. Examples of the manufacturing apparatus are semiconductor manufacturing apparatuses for performing various processes used in a semiconductor manufacturing factory, such as pre-process apparatuses (e.g., lithography apparatus including an exposure apparatus, a resist processing apparatus, and an etching apparatus, an annealing apparatus, a film formation apparatus, a planarization apparatus, and the like) and post-process apparatuses (e.g., an assembly apparatus, an inspection apparatus, and the like). The business office 801 comprises a host management system 808 for providing a maintenance database for the manufacturing apparatus, a plurality of operation terminal computers 810, and a LAN (Local Area Network) 809, which connects the host management system 808 and computers 810 to build an intranet. The host management system 808 has a gateway for connecting the LAN 809 to Internet 805 as an external network of the business office, and a security function for limiting external access.

Reference numerals 802 to 804 denote manufacturing factories of the semiconductor manufacturer as users of manufacturing apparatuses. The manufacturing factories 802 to 804 may belong to different manufacturers or the same manufacturer (e.g., a pre-process factory, a post-process factory, and the like). Each of the factories 802 to 804 is equipped with a plurality of manufacturing apparatuses 806, a LAN (Local Area Network) 811, which connects these apparatuses 806 to construct an intranet, and a host management system 807 serving as a monitoring apparatus for monitoring the operation status of each manufacturing apparatus 806. The host management system 807 in each of the factories 802 to 804 has a gateway for connecting the LAN 811 in the factory to the Internet 805 as an external network of the factory. Each factory can access the host management system 808 of the vendor 801 from the LAN 811 via the Internet 805. The security function of the host management system 808 authorizes access of only a limited user. More specifically, the factory notifies the vendor via the Internet 805 of status information (e.g., the symptom of a manufacturing apparatus in trouble), representing the operation status of each manufacturing apparatus 806, and receives response information (e.g., information designating a remedy against the trouble, or remedy software or data) corresponding to the notification, or maintenance information, such as the latest software or help information. Data communication between the factories 802 to 804 and the vendor 801, and data communication via the LAN 811 in each factory adopt a communication protocol (TCP/IP) generally used in the Internet. Instead of using the Internet as an external network of the factory, a dedicated network (e.g., an ISDN) having high security, which inhibits access of a third party, can be adopted. Also, the user may construct a database in addition to the one provided by the vendor and set the database on an external network, and the host management system may authorize access to the database from a plurality of user factories.

Figure 9:
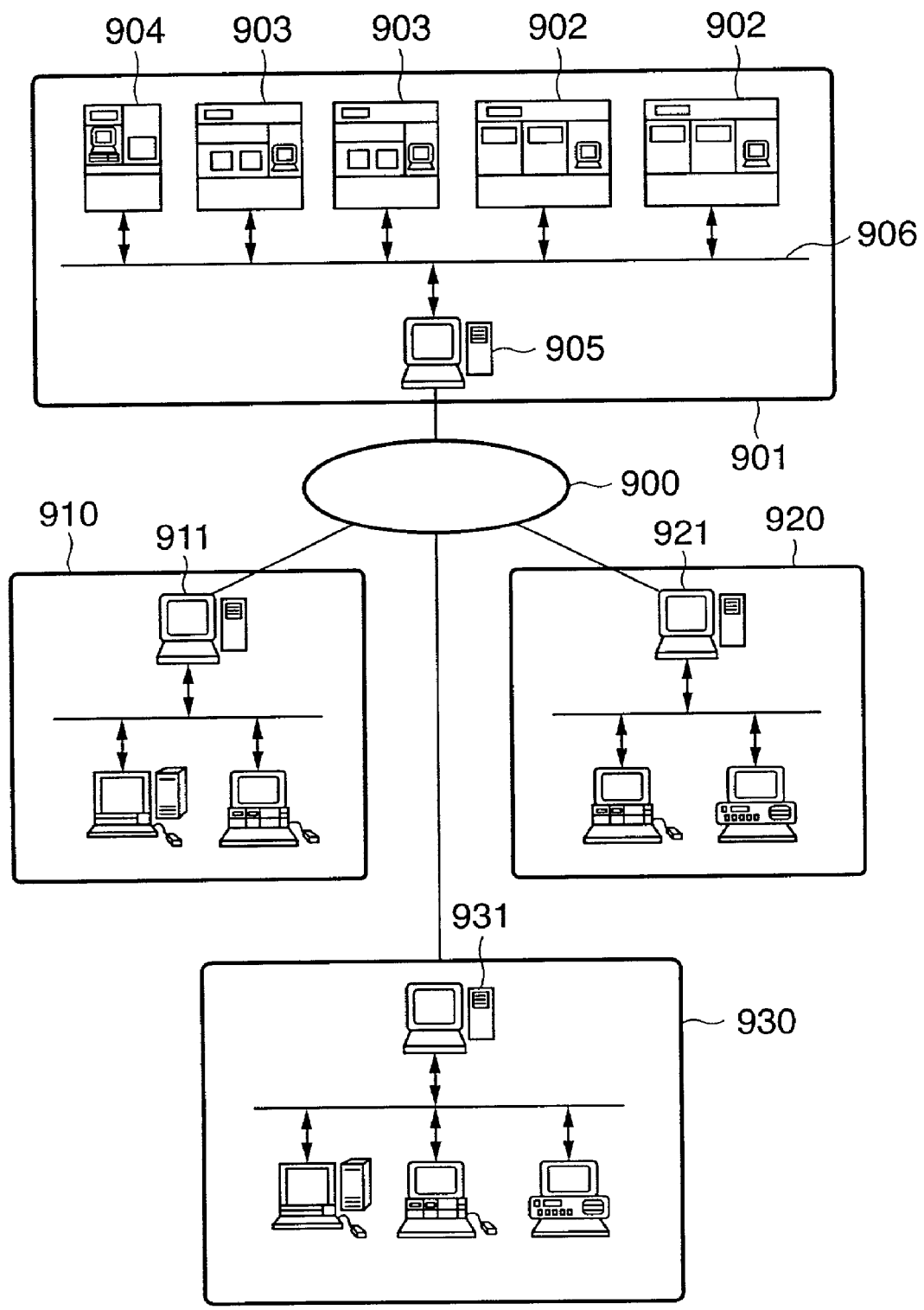
FIG. 9 is a view showing the concept of the semiconductor device production system, including the exposure apparatus according to the embodiment of the present invention, when viewed from another angle.

FIG. 9 is a view showing the concept of the overall system of this embodiment that is cut out at a different angle from that of FIG. 8. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 9, a factory having manufacturing apparatuses of a plurality of vendors and the management systems of the vendors for these manufacturing apparatuses are connected via the external network of the factory, and maintenance information of each manufacturing apparatus is communicated. In FIG. 9, reference numeral 901 denotes a manufacturing factory of a manufacturing apparatus user (e.g., a semiconductor device manufacturer) where manufacturing apparatuses for performing various processes, e.g., an exposure apparatus 902, a resist processing apparatus 903, and a film formation apparatus 904 are installed in the manufacturing line of the factory. FIG. 9 shows only manufacturing factory 901, but a plurality of factories are networked in practice. The respective apparatuses in the factory are connected to a LAN 906 to build an intranet, and a host management system 905 manages the operation of the manufacturing line. The business offices of vendors (e.g., apparatus supply manufacturers), such as an exposure apparatus manufacturer 910, a resist processing apparatus manufacturer 920, and a film formation apparatus manufacturer 930 comprise host management systems 911, 921, and 931 for executing remote maintenance fro the supplied apparatuses. Each host management system has a maintenance database and a gateway for an external network, as described above. The host management system 905 for managing the apparatuses in the manufacturing factory of the user, and the management systems 911, 921, and 931 of the vendors for the respective apparatuses are connected via the Internet or dedicated network serving as an external network 900. If trouble occurs in any one of a series of manufacturing apparatuses along the manufacturing line in this system, the operation of the manufacturing line stops. This trouble can be quickly solved by remote maintenance from the vendor of the apparatus in trouble via the Internet 900. This can minimize the stoppage of the manufacturing line.

Each manufacturing apparatus in the semiconductor manufacturing factory comprises a display, a network interface, and a computer for executing network access software and apparatus operating software, which are stored in a storage device. The storage device is a built-in memory, a hard disk, or a network file server. The network access software includes a dedicated or general-purpose web browser, and provides a user interface having a window as shown in FIG. 10 on the display. While referring to this window, the operator who manages manufacturing apparatuses in each factory inputs, in input items on the windows, pieces of information such as the type of manufacturing apparatus 1001, serial number 1002, subject of trouble 1003, occurrence date 1004, degree of urgency 1005, symptom 1006, remedy 1007, and progress 1008. The pieces of input information are transmitted to the maintenance database via the Internet, and appropriate maintenance information is sent back from the maintenance database and displayed on the display. The user interface provided by the web browser realizes hyperlink functions 10101, 1011, and 1012, as shown in FIG. 10. This allows the operator to access detailed information of each item, receive the latest-version software to be used for a manufacturing apparatus from a software library provided by a vendor, and receive an operation guide (help information) as a reference for the operator in the factory. Maintenance information provided by the maintenance database also includes information concerning the present invention described above. The software library also provides the latest software for implementing the present invention. The maintenance information provided by the maintenance database also includes information about the present invention described above. The software library also provides the latest-version software for implementing the present invention.

Figure 11:
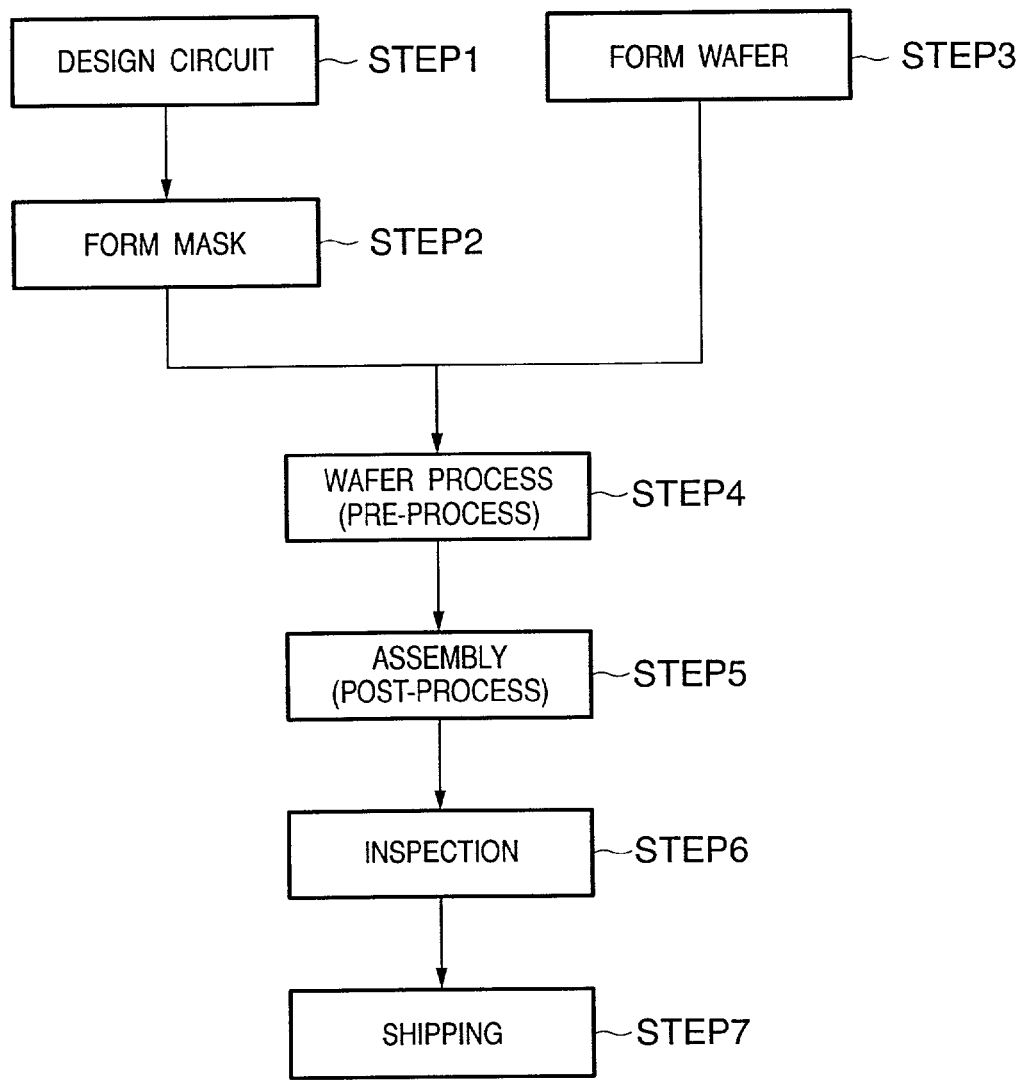
FIG. 11 is a flow chart for explaining the flow of a device manufacturing process by the exposure apparatus according to the embodiment of the present invention.

A semiconductor device manufacturing process using the above-described production system will be explained. FIG. 11 shows the flow of the whole manufacturing process of the semiconductor device. In step 1 (circuit design), a semiconductor device circuit is designed. In step 2 (mask formation), a mask having the designed circuit pattern is formed. In step 3 (wafer formation), a wafer is formed by using a material such as silicon. In step 4 (wafer process), called a pre-process, an actual circuit is formed on the wafer by lithography using the prepared mask and wafer. Step 5 (assembly), called a post-process, is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process are performed in separate dedicated factories, and maintenance is done in each of the factories by the above-described remote maintenance system. Information for production management and apparatus maintenance is communicated between the pre-process factory and the post-process factory via the Internet or dedicated network.

Figure 12:
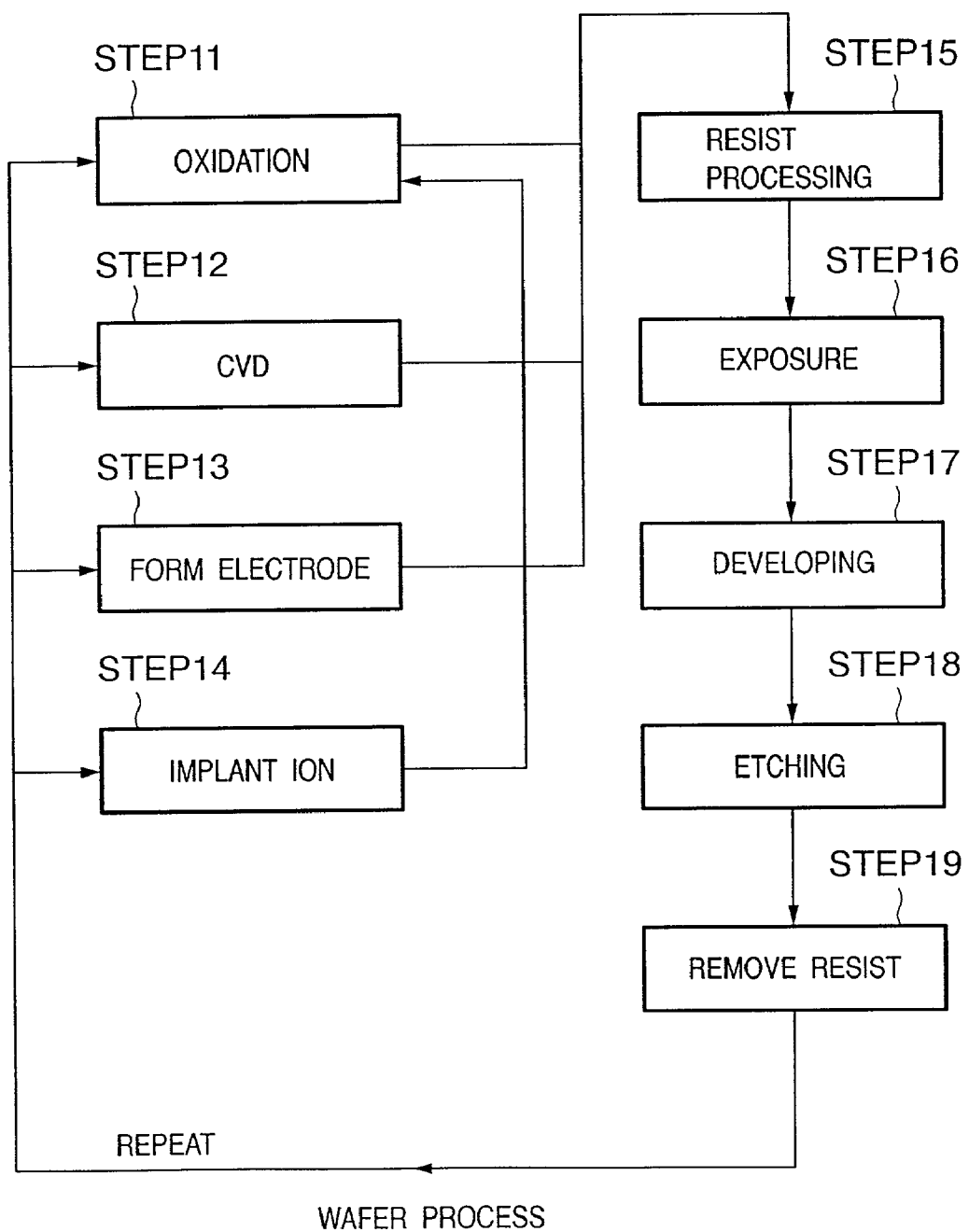
FIG. 12 is a flow chart for explaining a wafer process by the exposure apparatus according to the embodiment of the present invention.

FIG. 12 shows the detailed flow of the wafer process. In step 11 (oxidation), the wafer surface is oxidized. In step 12 (CVD), an insulting film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

As has been described above, the embodiments can provide an exposure apparatus and a method with a resolving power higher than that corresponding to the wavelength of a light source and a shorter exposure time by arranging a light source smaller in size than the emission wavelength by a distance equal to or shorter than the wavelength from an object to be exposed.

According to the embodiments, a plurality of light source (light-emitting portions) close to each other are prepared and can selectively emit light. By selectively emitting light from a plurality of light sources, a plurality of exposure patterns can be exposed without exchanging masks or the like.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus comprising:
   a light-emitting portion and electrodes formed on a surface of a substrate, said light-emitting portion having a width smaller than a wavelength of light emitted from said light-emitting portion, and said electrodes sandwiching said light-emitting portion along the surface and applying a voltage to said light-emitting portion for emitting the light; and
   a positioning mechanism that arranges the substrate so as to set a gap between said light-emitting portion and a photosensitive member to be shorter than the wavelength of the light from said light-emitting portion.

2. The apparatus according to claim 1, further comprising:
   a plurality of light-emitting portions; and
   an emission control device causing said plurality of light-emitting portions to selectively emit light.

3. The apparatus according to claim 1, wherein said light-emitting portion emits light by voltage application.

4. The apparatus according to claim 1, wherein said light-emitting portion is formed from a semiconductor ultra-fine particle.

5. The apparatus according to claim 1, wherein said light-emitting portion takes an arbitrary shape.

6. The apparatus according to claim 1, wherein said positioning mechanism detects a distance by using an electrostatic capacitance sensor, and controls the distance by using a piezoelectric element.

7. The apparatus according to claim 1, further comprising:
   a display;
   a network interface; and
   a computer for executing network software;
   wherein said display, said network interface, and said computer enable data communication of maintenance information for the exposure apparatus via a computer network.

8. A semiconductor manufacturing factory comprising:
   manufacturing apparatuses, for performing various processes, including an exposure apparatus comprising a light-emitting portion and electrodes formed on a surface of a substrate, said light-emitting portion having a width smaller than a wavelength of light emitted from said light-emitting portion and said electrodes sandwiching said light-emitting portion along the surface and applying a voltage to said light-emitting portion for emitting the light, and a positioning mechanism that arranges the substrate so as to set a gap between said light-emitting portion and a photosensitive member to be shorter than the wavelength of the light from said light-emitting portion;
   a local area network for connecting said manufacturing apparatuses; and
   a gateway for allowing access to an external network outside the factory from said local area network,
   wherein data communication of information about at least one of said manufacturing apparatuses is enabled.

* * * * *

UNITED STATES PATENT AND TRADEMARK OFFICE
CERTIFICATE OF CORRECTION

PATENT NO. : 7,068,353 B2  Page 1 of 1
APPLICATION NO. : 10/011974
DATED : June 27, 2006
INVENTOR(S) : Koji Yano et al.

It is certified that error appears in the above-identified patent and that said Letters Patent is hereby corrected as shown below:

COLUMN 2:
Line 25, "preferably" should read -- preferably, --.
Line 42, "preferably" should read -- preferable -- and "use" should read -- user --.

COLUMN 6:
Line 26, "portion" should read -- portions --.

COLUMN 7:
Line 6, "light emitting" should read -- light-emitting --.
Line 45, "is" should rad -- are --.
Line 58, "the" should read -- to the --.

COLUMN 8:
Line 2, "i" should read -- in --.
Line 63, "light emitting" should read -- light-emitting --.

COLUMN 11:
Line 30, "fro" should read -- for --.
Line 64, "10101," should read -- 1010, --.

COLUMN 12:
Line 39, "insulting" should read -- insulating --.
Line 65, "source" should read -- sources --.

Signed and Sealed this

Twenty-sixth Day of December, 2006

JON W. DUDAS
*Director of the United States Patent and Trademark Office*